United States Patent
Hertz et al.

(12)

(10) Patent No.: US 6,471,111 B1
(45) Date of Patent: Oct. 29, 2002

(54) METHOD AND APPARATUS FOR ACOUSTIC PRESSURE ASSISTED WAVE SOLDERING

(76) Inventors: Allen D. Hertz, 12784 Tulipwood Cir., Boca Raton, FL (US) 33428; Dennis D. Epp, 171 Stonecliffe Aisle, Irvine, CA (US) 92612; Eric L. Hertz, 12784 Tulipwood Cir., Boca Raton, FL (US) 33428

( * ) Notice: Subject to any disclaimer, the term of this patent is extended or adjusted under 35 U.S.C. 154(b) by 0 days.

(21) Appl. No.: 09/234,328

(22) Filed: Jan. 20, 1999

Related U.S. Application Data

(60) Provisional application No. 60/071,866, filed on Jan. 20, 1998.

(51) Int. Cl.[7] ................................................. B23K 1/06
(52) U.S. Cl. ............................... 228/111.5; 228/180.21; 228/110.1; 228/36
(58) Field of Search ........................ 228/111.5, 180.21, 228/110.1, 36; 219/388, 480

(56) References Cited

U.S. PATENT DOCUMENTS 4,632,291 A * 12/1986 Rahn et al. ..................... 228/9

FOREIGN PATENT DOCUMENTS

| JP | 360177954 A | * | 9/1985 | ............... 228/111.5 |
| JP | 4152708 A | * | 5/1992 | .................. 333/193 |
| JP | 8203956 A | * | 8/1996 | ............ H01L/21/60 |
| SU | 831447 B | * | 5/1981 | ............. B23K/1/06 |

* cited by examiner

*Primary Examiner*—M. Alexandra Elve
(74) *Attorney, Agent, or Firm*—Allen D. Hertz

(57) ABSTRACT

A method and apparatus are disclosed for improving the release of molten solder from a module via the introduction of acoustic pressure waves to the module and/or molten solder wave. The acoustic pressure waves may be created by a transducer where the waves are transferred to the module and/or solder wave through the air or reduced oxygen atmosphere. The acoustic pressure waves impinge on the molten solder and the module to reduce solder skips, bridges and icicles. The acoustic pressure waves are directed at the module/molten solder boundary to apply pressure to the boundary causing a shearing action. The shearing action causes the excess molten solder to fall, with the aid of gravity, into the molten solder bath.

12 Claims, 5 Drawing Sheets

METHOD AND APPARATUS FOR ACOUSTIC PRESSURE ASSISTED WAVE SOLDERING

This patent application claims priority from U.S. Provisional Application No. 60/071,866, filed Jan. 20, 1998, entitled Vibrational Energy for Improved Soldering of Printed Circuit Assemblies.

FIELD OF THE INVENTION

This invention relates in general to the field of wave soldering systems, and in particular to a method and apparatus for acoustic pressure assisted wave soldering.

BACKGROUND OF THE INVENTION

Wave Soldering is an established method of soldering electronic components to a Printed Circuit Board (PCB). There is a wide variety of equipment and processes available to wave solder PCBs, however, the general principles of the process remain the same, as explained below.

Components are assembled to the PCB by placing component leads into plated through holes or by gluing surface mount components to a bottom surface of the PCB. This unsoldered assembly is called a Printed Circuit Assembly (PCA) or module with components loosely mounted or glued. Flux is applied to the module, and the flux removes the oxides from the surfaces to be soldered. The module is preheated to activate the flux and reduce thermal shock subjected by the wave of molten solder. A wave of molten solder is applied to the bottom side of the module. The molten solder fuses to the exposed metal surfaces of the module, which include annular rings, pads, and component leads. Additionally, capillary and wetting forces draw the solder into the plated through holes. The excess molten solder is removed from the bottom of the module typically by transferring the module up and away from the molten solder, allowing gravity and surface tension to separate the molten solder from the module.

The limitations of this process continue to be challenged as the inclusion of surface mount components on the bottom surface of the module, and the decrease in size of the line widths, spacing between adjacent vias, and distance between leads. Defects such as solder skips resulting from a lack of sufficient solder and solder bridges and icicles resulting from excess solder continue to create quality issues during the manufacturing of electronics products.

The desirable outcome of the wave solder process is for components to be sufficiently soldered to the module to form reliable, electrically conductive, and mechanically robust solder joints. Solder interconnects which comprise insufficient solder are sometimes called solder skips and are undesirable because they may cause open circuits. Solder interconnects which comprise excess solder are called solder bridges (between two adjacent solder connections) or icicles (excess solder hanging from a solder connection) and are undesirable because they may short contacts, leads or pads together, and potentially cause electrical failure. Various processes and devices are available to avoid these skips, bridges and icicles. In one case, reference is made to U.S. Pat. No. 5,240,169 where the module is soldered in a reduced oxygen atmosphere for reducing oxides on the solderable surfaces of the PCB and components improving wetting of the surfaces. The typical gas used in this method is nitrogen. The gas is continually fed into the soldering area to limit the amount of oxygen present. This method is expensive, as relatively pure nitrogen must be used. In another case, reference is made to U.S. Pat. No. 4,684,056, which discloses a method for vibratory wave solder, promoting solder penetration into narrow spaces between components, filling of small holes in a board, filling crevices, and all other areas where solder wetting is difficult to achieve with conventional machines. This method of mass vibration of the solder pot is difficult to control, sometimes causing too much solder to be present potentially raising components to a non-desirable position and causing excess solder or solder balls on the component side of the module, and sometimes too little, not allowing the system to be effective. Additionally, there is a potential to damage sensitive components with direct mechanical coupling of vibrational energy. In yet another case, reference is made to U.S. Pat. No. 5,228,614 where a non-oxidizing gas air knife is used to remove solder bridges and icicles. The air knife passes air across the assembly. Air flow increases heat transfer, as it removes the thermal boundary layer created between the module and the surrounding air temperature, similar to a common phenomena referred to as wind chill. This may cause undesirable thermal stresses on the solder joints. This method is also difficult to control for a wide variety of modules. Too much pressure causes solder droplets to fly out of vias, sometimes landing on the module. Too little pressure is ineffective. Additionally, the method requires the air knife to be in close proximity to the module, limiting clearance on the bottom of the module. Reference is also made to U.S. Pat. No. 3,921,888, which discloses the wave soldering of printed circuits wherein the pins projecting through a circuit board move on a conveyor at approximately the same speed as a smooth stream of solder from the solder wave so that the relative movement between the pins and the solder is substantially a vertical movement to avoid side icicles of solder forming. This method does not reduce the level of defects to an acceptable level and is usually combined with other defect reduction strategies.

While each of these improvements has contributed to the art, skips, bridges, and icicles remain a problem in the industry.

Thus, what is desirable, is a means to reliably connect components to form the desired solder interconnects to assemble a module while minimizing common defects such as skips, bridges and icicles.

SUMMARY OF THE INVENTION

The present invention addresses the deficiencies in the art by applying acoustic pressure waves proximate to the interface of the molten solder and the module such that the energy aids to improve the manufacturing yield. The pulsating energy increases the yield over the prior art solutions by breaking up any solder shorts or removing icicles, as well as causing small surface waves which eliminate solder skips.

One aspect of the current invention is to provide a means to apply solder to the desirable side of a module.

A second aspect of the present invention is to provide a means to use acoustic pressure waves to remove skips, bridges, and icicles from the module.

A third, aspect of the invention is to provide a means to apply flux to the module prior to providing a means to apply solder to the module. The flux is applied to remove the oxides on the solderable surfaces, resulting in improved solderability.

A fourth, aspect of the present invention is to provide a means to apply the acoustic pressure waves on the module to reduce bridges while utilizing other process improvement techniques known in the art, such as inert gas soldering, non-oxidizing air knife soldering, vibrational soldering from within the molten solder, and/or controlled solder velocity (non-turbulent wave) soldering.

The present invention comprises an apparatus used to apply molten solder to the bottom surface of a module to create electro-mechanical interconnects during the assembly of a module. The apparatus preferably includes equipment known in the art: a conveyor to move the module across a flux applicator, through preheaters, and across a molten solder bath.

The present invention discloses the application of acoustic pressure waves to add energy to the molten solder proximate along the final interface between the molten solder wave and the module, thus overcoming the surface tensional forces. The acoustic pressure waves, transferred to the boundary between the module and the molten solder bath, preferably is at the exit of the molten solder bath, and may create shearing forces between the module and the molten solder bath. These shearing forces may force the excess volume of molten solder adhering to the module to fall downward into the molten solder bath. Because the module is preferably above the molten solder, gravity may aid in the complete transfer of the excess volume from the module to the molten solder bath. The acoustic pressure wave energy applied to the interface creates small waves and aids in creating solder interconnects on joints which may otherwise have created a skip, while removing excess solder as described above.

The acoustic pressure waves may preferably be created by a transducer and transferred to the module and molten solder bath boundary through the air.

DETAILED DESCRIPTION OF THE INVENTION

Figure 1:
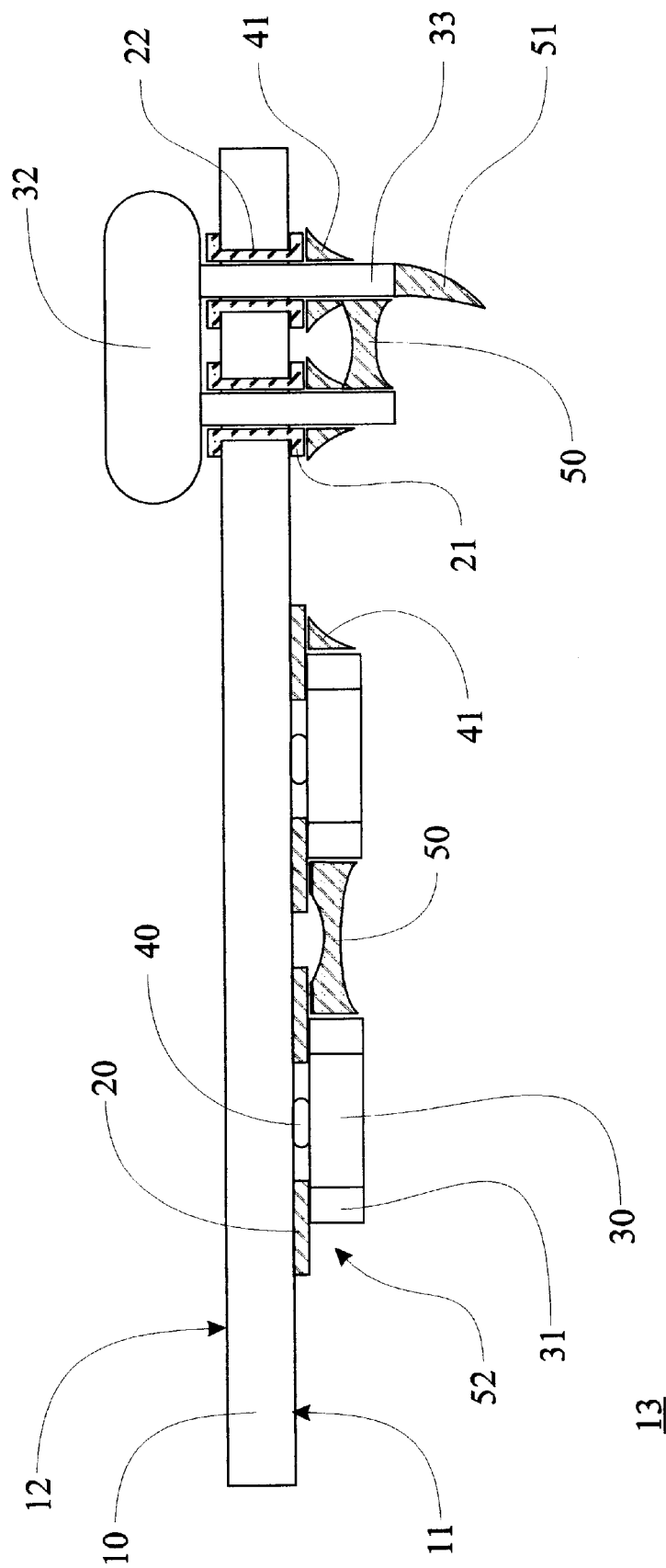
FIG. 1 is a sectional side elevation of a module illustrating the three defect types resulting from typical wave soldering processing.

FIG. 1 illustrates a sectional side elevation of a module 13. The module 13 consists of a Printed Circuit Board (PCB) 10 which has two 2 sides; a solder side 11 and a component side 12. The PCB 10 includes locations which act to electro-mechanically couple the components to the circuitry within the PCB 10. These locations may vary, but examples illustrated are solder pads 20, annular rings 21, and plated through holes 22. Surface mount components 30 include terminations 31 which may be of many materials and shapes to provide a location for electro-mechanical coupling from the solder pads 20 on the PCB 10 to the surface mount component 30. Through hole components 32 include leads 33 may be placed through plated through holes 22 and are interconnected from the leads 33 to the annular rings 21. The surface mount components 30 may be assembled to the PCB 10 prior to wave soldering by applying adhesive 40, placing the surface mount component 30, then curing the adhesive 40. The figure illustrates desirable solder joints 41 as well as non-desirable solder joints: excessive solder causing solder bridges 50 and icicles 51, and insufficient solder or solder skips 52.

Figure 2:
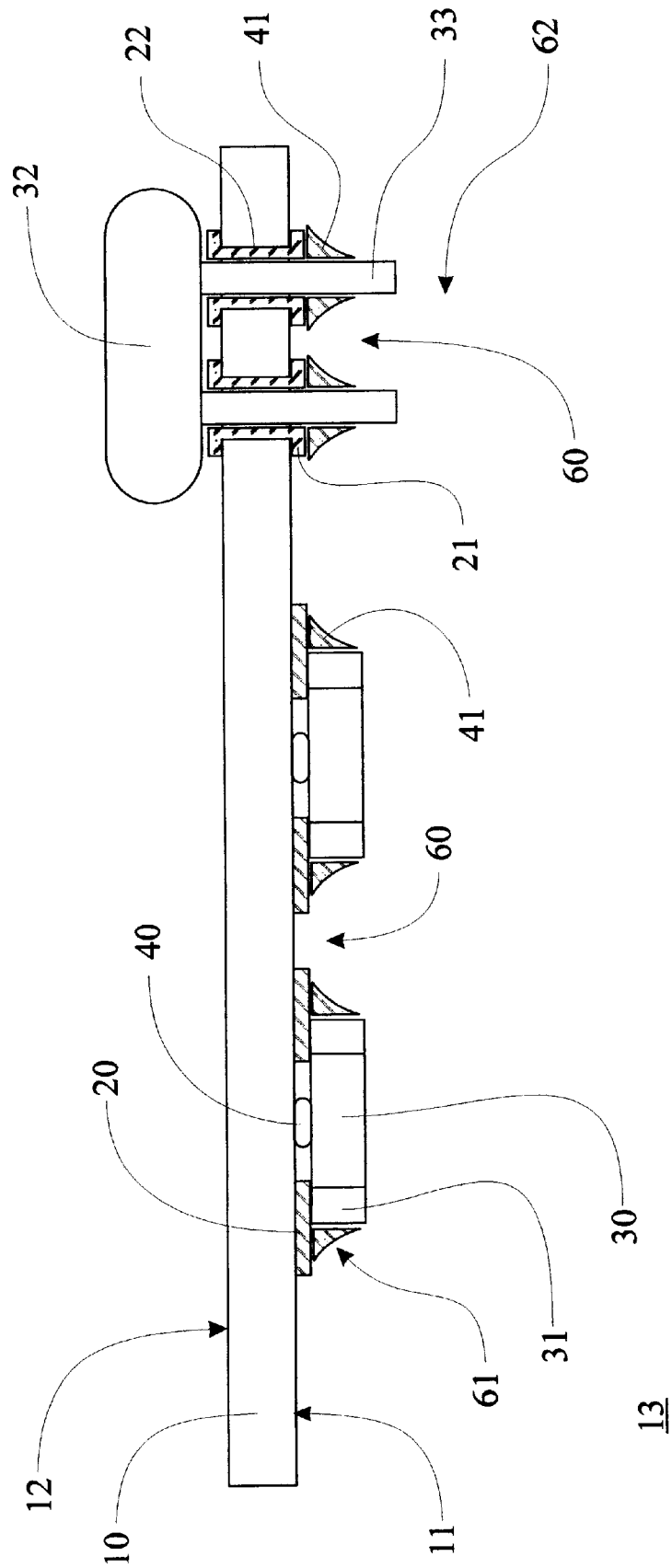
FIG. 2 is a sectional side elevation of the same module in FIG. 1 with the defects removed.

FIG. 2 illustrates the same module 13 in the side sectional elevation shown in FIG. 1, with desirable solder joints. The figure illustrates no solder bridging 60 between adjacent leads 33 or terminations 31, no solder skips 61, and no icicles 62.

Figure 3:
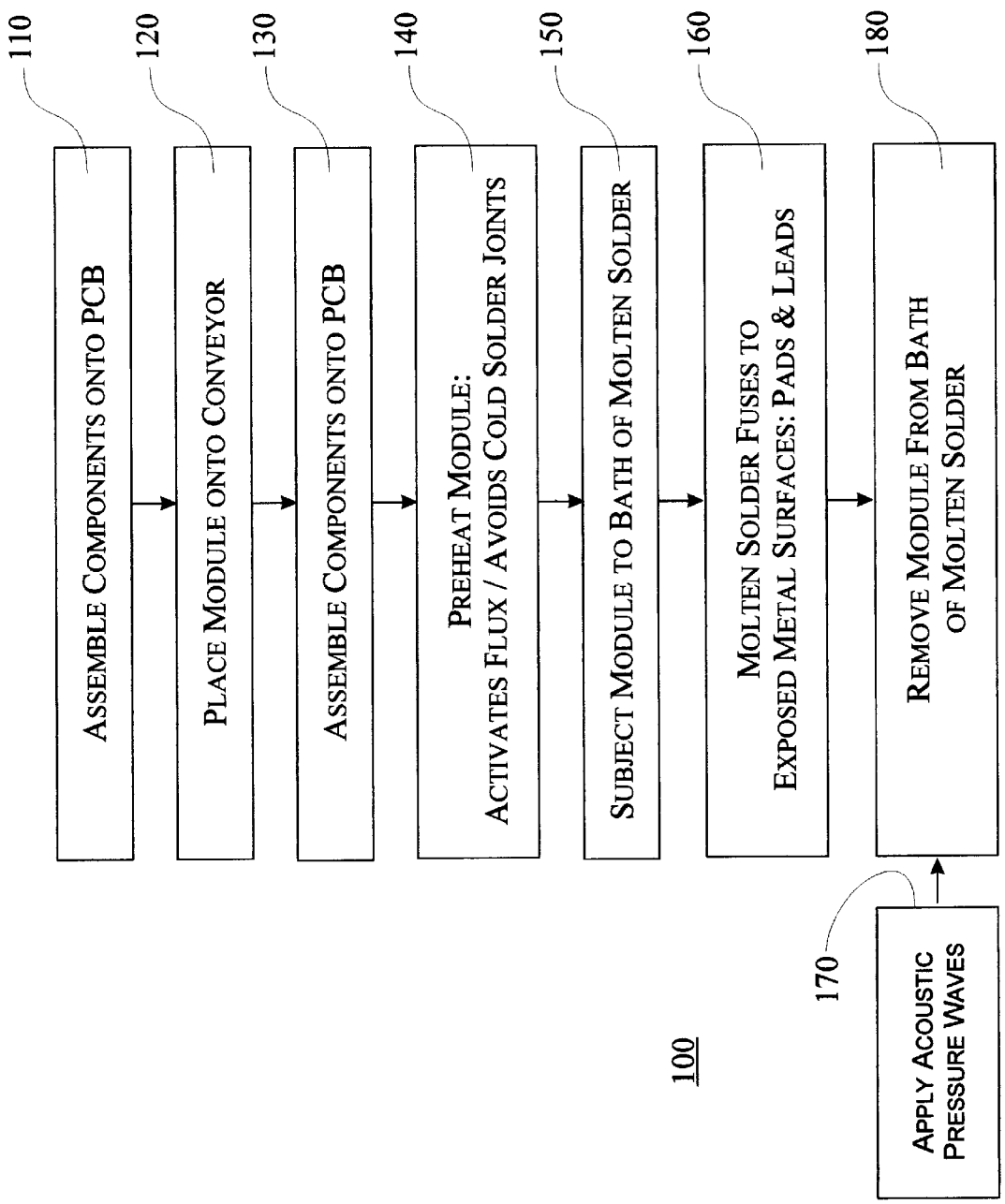
FIG. 3. is a flow diagram which illustrates the general wave soldering assembly process in conjunction with the present invention.

FIG. 3. is a flow diagram 100 illustrating the general wave solder assembly process. The first step 110 in the wave solder assembly process is to assemble surface mount components 30 and through hole components 32 onto the PCB 10. The second step 120 in the wave solder assembly process is to place the module 13 onto a conveyor (not shown in figures). The third step 130 in the wave solder assembly process is to apply flux (not shown in figures) to the solder side 11 of the module 13. The fourth step 140 in the wave solder assembly process is to preheat the module 13. The preheating process prepares the areas to be soldered by activating the flux which removes the oxides of the exposed metal and heating the assembly to avoid cold solder joints. The fifth step 150 in the wave solder assembly process is to subject the fluxed and heated module 13 to a moving bath of molten solder 210. The sixth step 160 is the result of the fifth step 150 where the molten solder 210 fuses to the exposed metal surfaces, more specifically, the solder pads 20, annular rings 21, and the leads 33 and terminations 31 of the surface mount components 30 and the through hole components 32. The seventh step 170 is applied proximate in time to the eighth step 180, during the removal of the module 13 from the molten solder 210. The seventh step 170 is the application of acoustic pressure waves 310, directed substantially proximate the interface between the module 13 and the molten solder 210.

Figure 4:
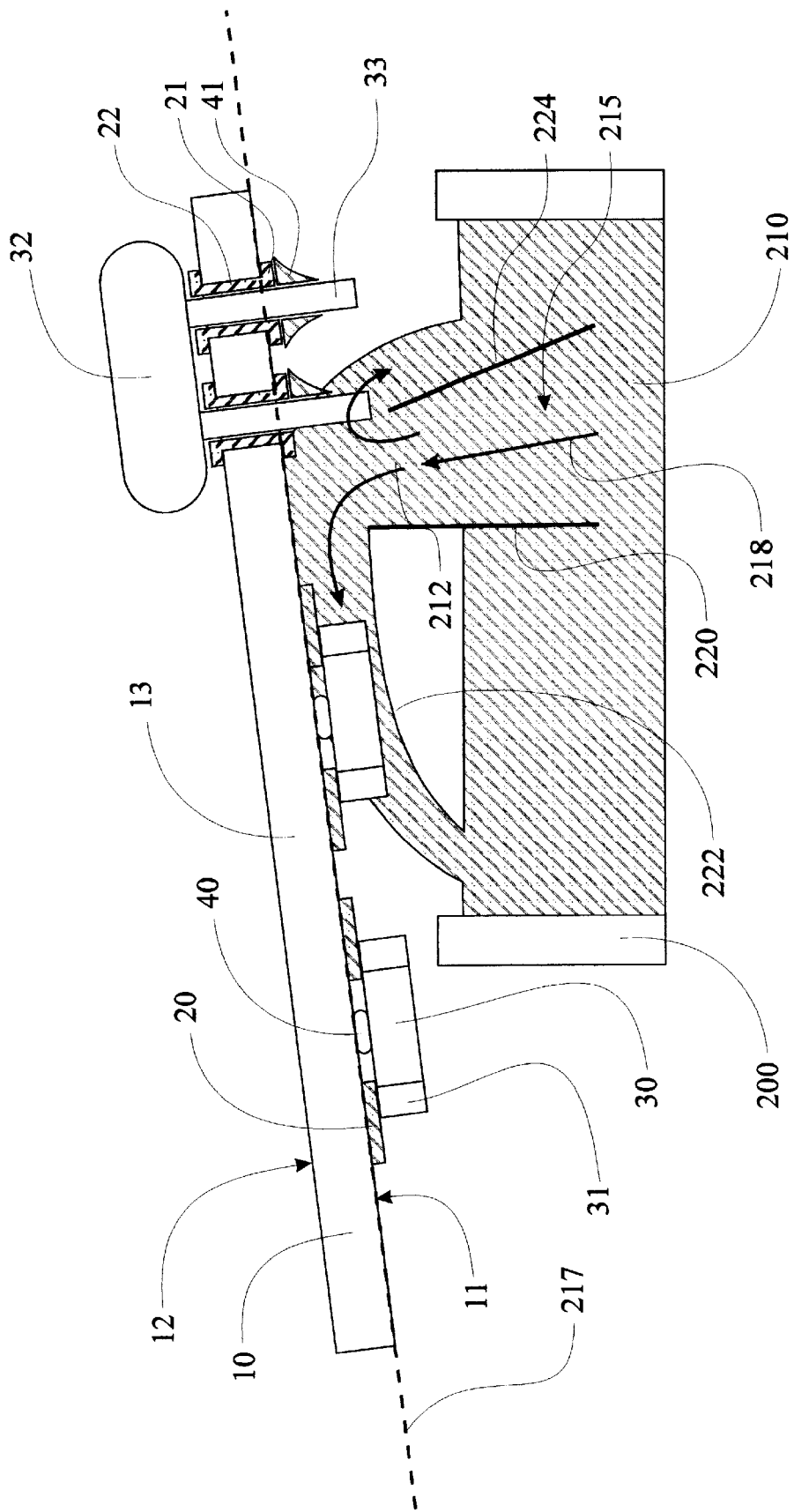
FIG. 4 is a sectional side elevation of a module in contact with a solder wave on conventional wave soldering equipment.

FIG. 4 illustrates a sectional side elevation of a typical solder pot 200 of a wave solder system. The wave solder system includes a solder pot 200 which produces heat and maintains molten solder 210. The nozzle 212 is attached to a solder supply conduit 215. Molten solder 210 exits the nozzle 212 and forms the desired shape of the solder wave. The molten solder 210 flows back into the solder pot 200. Above the solder pot 200 is a path 217 along which modules 13 are conveyed. The drawings illustrate a straight, inclined path 217, however, the present invention may be applied to solder wave machines with horizontal or curved paths. The printed wiring boards 10 may have surface mounted components 30 with solder pads 20, annular rings 21, and terminations 31 and leads 33 to be coated with molten solder 210 and form desirable solder joints 41. The entry side of nozzle 220 has a guide 222 to provide a downward sloping path for a portion of the molten solder 210. The molten solder on the exit side of the nozzle 224 may flow- at a velocity substantially similar to the velocity of the module 13 creating a substantially non-turbulent wave.

Figure 5:
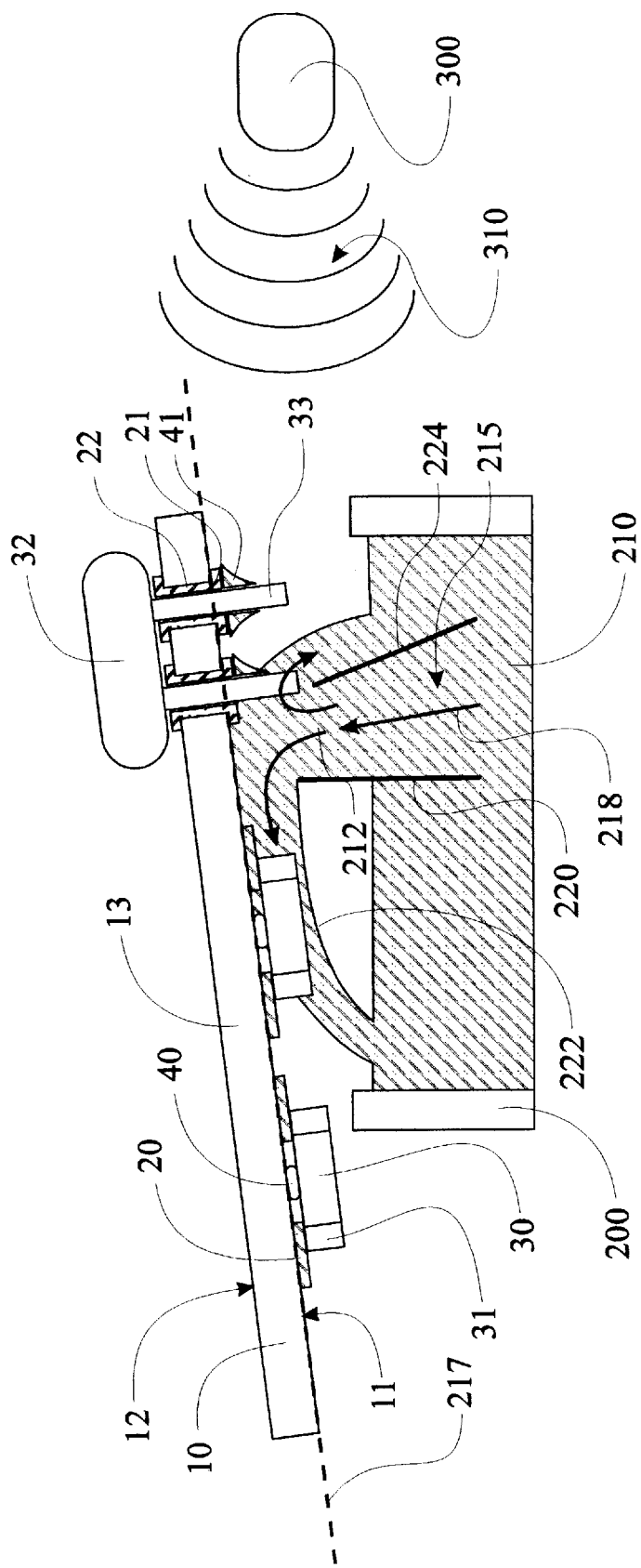
FIG. 5 repeats the same illustration as FIG. 4, with the inclusion of a transducer.

FIG. 5 repeats the same illustration as FIG. 4, with the inclusion of a transducer. The illustration shows the PCB 10 with the surface mounted components 30 and the through hole components 32 along with their relations to each respective solder pad 20 and annular ring 21 as it passes over the solder pot 200 of molten solder 210. A transducer 300 which produces acoustic pressure waves 310, is introduced at the exit of the printed circuit board path 217. The amplitude, frequency, and angle of incidence may optionally be variably controlled and may include oscillations in the vertical or horizontal planes. Additionally, it would be understood that multiple transducers 300 may be utilized as desired.

Various changes may be made to the embodiment shown herein without departing from the scope of the present invention which is limited only by the following claims.

What is claimed is:

1. A wave soldering apparatus comprising:

a means to apply molten solder to a desirable surface of a module, a means to transfer the module across the molten solder, a means to apply acoustic pressure waves through air to the module/solder interface proximate the exit of the wave.

2. The apparatus of claim 1 where the means to produce the acoustic pressure waves utilizes a transducer.

3. The apparatus of claim 1 where the means to produce the acoustic pressure waves includes a means to at least one of vary and oscillate an angle of direction towards the module/solder interface.

4. The apparatus of claim 1 where the means to produce the acoustic pressure waves utilizes multiple transducers.

5. A wave soldering apparatus comprising:

a means to apply molten solder to the desirable surface of a module, a means to transfer the object across the molten solder, a means to apply acoustic pressure waves through air proximate to the module/solder interface at the exit of the wave, where the means produces ultrasonic frequencies.

6. The apparatus of claim 5 where a transducer is used to produce the acoustic pressure waves.

7. The apparatus of claim 5 where the air is a reduced oxygen atmosphere.

8. The apparatus of claim 1 where the air is a reduced oxygen atmosphere.

9. The apparatus of claim 4 where the means to produce the acoustic pressure waves includes a means to at least one of vary and oscillate an angle of direction towards the module/solder interface.

10. The apparatus of claim 5 where the means to produce the acoustic pressure waves includes a means to at least one of vary and oscillate an angle of direction towards the module/solder interface.

11. The apparatus of claim 5 where the means to produce the acoustic pressure waves utilizes multiple transducers.

12. The apparatus of claim 11 where the means to produce the acoustic pressure waves includes a means to at least one of vary and oscillate an angle of direction towards the module/solder interface.

\* \* \* \* \*